United States Patent [19]

Ury et al.

[11] Patent Number: 4,859,906
[45] Date of Patent: Aug. 22, 1989

[54] DEEP UV LAMP BULB WITH IMPROVED FILL

[75] Inventors: Michael G. Ury, Bethesda; Charles H. Wood, Rockville, both of Md.

[73] Assignee: Fusion Systems Corportion, Rockville, Md.

[21] Appl. No.: 433,069

[22] Filed: Oct. 6, 1982

[51] Int. Cl.⁴ .................. H01J 11/02; H01J 7/10; H01J 65/04; H01J 61/20
[52] U.S. Cl. .................. 313/639; 315/248; 315/267; 313/637
[58] Field of Search ............ 315/248, 267, 39, 111.51, 315/344; 313/637, 639, 643, 565, 571, 231.61, 567

[56] References Cited

U.S. PATENT DOCUMENTS

| 3,521,111 | 7/1970 | Tsuchihashi et al. | 313/639 |
| 3,786,308 | 1/1974 | Browner et al. | 315/248 |
| 3,873,884 | 3/1975 | Gabriel | 315/344 X |
| 3,943,402 | 3/1976 | Haugsjaa et al. | 315/39 |
| 4,001,632 | 1/1977 | Haugsjaa et al. | 313/567 X |
| 4,427,921 | 1/1984 | Proud et al. | 315/248 |

FOREIGN PATENT DOCUMENTS

| 2845890 | 6/1979 | Fed. Rep. of Germany | 313/637 |
| 55-76564 | 6/1980 | Japan | 315/248 |
| 55-113252 | 9/1980 | Japan | 313/231.61 |
| 469166 | 4/1975 | U.S.S.R. | 313/639 |
| 1351280 | 4/1974 | United Kingdom | 315/248 |

OTHER PUBLICATIONS

Browner et al., "Improvements in Electrodeless Discharge Lamp Radiant Flux and Stability by Precise Temperature Control", Pittsburgh Conf. on Anal. Chem. and Appl. Spectroscopy, Cleveland, Mar. 7, 1972.

Primary Examiner—Howard W. Britton
Assistant Examiner—Mark R. Powell
Attorney, Agent, or Firm—Pollock, Vande Sande & Priddy

[57] ABSTRACT

An electrodeless lamp bulb comprises of a quartz envelope and a fill containing mercury in a ratio of from 0.5–0.9 microliters per milliliter of envelope volume at room temperature. A lamp including such bulb which is powered by microwaves.

8 Claims, 2 Drawing Sheets

DEEP UV LAMP BULB WITH IMPROVED FILL

The present invention is directed primarily to an improved lamp bulb for use in a deep ultraviolet light source, and also to a source which incorporates the improved bulb.

An important use for deep ultraviolet (deep UV) light sources presently is in the practice of semiconductor photolithography. In conventional UV photolithography, a pattern in an optical mask, which corresponds to the features of an integrated circuit to be manufactured is imaged on to a semiconductor wafer which ha been coated with a UV sensitive photoresist with ultraviolet light at conventional wavelengths (260–460 nm). After the pattern is exposed on the wafer, it undergoes further processing, and ultimately results in a transistor device or integrated circuit.

In order to produce integrated circuits having greater component densities, it is necessary to image patterns having narrower lines on the semiconductor substrate than can be effected with conventional ultraviolet light, and thus sources which produce deep UV (210–240 nm) have been proposed, and to a certain extent utilized. An improved electrodeless deep UV source for use in semiconductor photolithography is disclosed in copending U.S. application Ser. Nos. 362,825 and 381,481, which are assigned to the same assignee as the present application.

In order to have an effective deep UV electrodeless source for photolithography, it is necessary to provide a lamp bulb having a fill which is capable of producing a very bright output with high spectral content in the deep UV region when suitably excited,-and for certain applications particularly within the 220–230 nm bandwidth. It was found that existing electrodeless lamp bulbs and those constructed in accordance with prior art teachings were not capable of performing at required brightness levels with the necessary deep UV output.

Such prior electrodeless bulbs include the linear bulbs for industrial curing manufactured by Fusion Systems Corporation, Rockville, Md., and the spherical and other geometrically shaped electrodeless bulbs disclosed in U.S. Pat. Nos. 3,943,402; 3,943,401; 4,185,228; 3,942,058; 3,993,927; and 4,001,031. All of the above-mentioned bulbs utilize a mercury fill wherein the mercury is present in specific volumetric proportion to bulb volume.

It is therefore an object of the invention to provide an improved deep UV electrodeless lamp bulb.

It is a further object of the invention to provide a deep UV lamp bulb which radiates at high brightness levels with relatively high output in the deep UV portion of the spectrum.

It is still a further object of the invention to provide a deep UV light source which incorporates the improved lamp bulb of the invention.

The invention is based on the discovery that the volume of mercury which is contained in the lamp bulb is critical for effective deep UV operation. In accordance with the invention a mercury fill having a volume ratio of 0.5–0.9 μl per ml of bulb volume at room temperature (72° F.) is provided.

It has been found that while higher mercury pressures result in coupling of higher microwave power levels to the bulb, resulting in potentially higher brightness, more mercury in the bulb also results in absorption of some of the radiated energy by the plasma itself, and in particular, preferential absorption of deep UV wavelengths. It has been determined by applicants that within the critical region of 0.5–0.9 μl/ml, these effects are suitably balanced, and the bulb provides relatively bright deep UV output, especially in the required 220–230 nm range. Additionally, at a frequency 2450 Mhz and for coupled power densities in excess of 300 watt/cc, which are necessary to provide the required brightness levels, the above-mentioned mercury fill ratio also results in a relatively small skin depth in the bulb, so that a substantial portion of the ultraviolet radiation is emitted at the outer radii of the bulb, thereby minimizing deep UV absorption by the body of the plasma and the neutral boundary layer which separates the plasma from the envelope wall.

The invention will be better understood by referring to the accompanying drawings in which.

Figure 1:
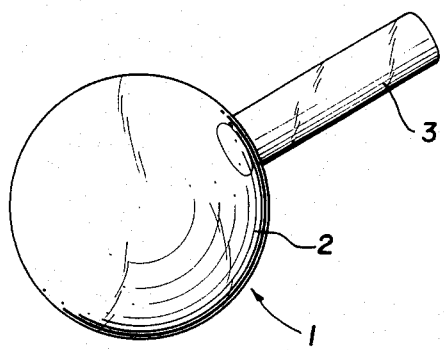
FIG. 1 is a schematic representation of an embodiment of an electrodeless lamp.

Referring to FIG. 1, electrodeless lamp bulb 1 is depicted, and is shown being attached to mounting stem 3. Lamp bulb 1 consists of envelope 2 of spherical or other shape, which contains a fill comprised primarily of mercury, a noble gas, and a substance such as HgCl which serves to keep the discharge off the envelope wall during operation.

When microwave energy is coupled to the bulb, the mercury heats up and forms a plasma, which emits ultraviolet light. In a light source for performing deep UV photolithography, a bright output which is high in the deep UV part of the spectrum is required, and an illustrative embodiment of a complete light source having the above characteristics is described in connection with FIGS. 3 and 4.

As mentioned above, it has been found by applicants that the volumetric ratio of mercury in the bulb is critical for producing a bright output with high deep UV spectral content. Thus, in accordance with the invention, a deep UV lamp bulb having a mercury fill therein in a volume ratio of 0.5–0.9 μl per ml of envelope volume at room temperature is provided. It is significant to note that the critical range of 0.5–0.9 μl/ml was arrived at after the dynamics of bulb physics were analyzed.

Figure 2:
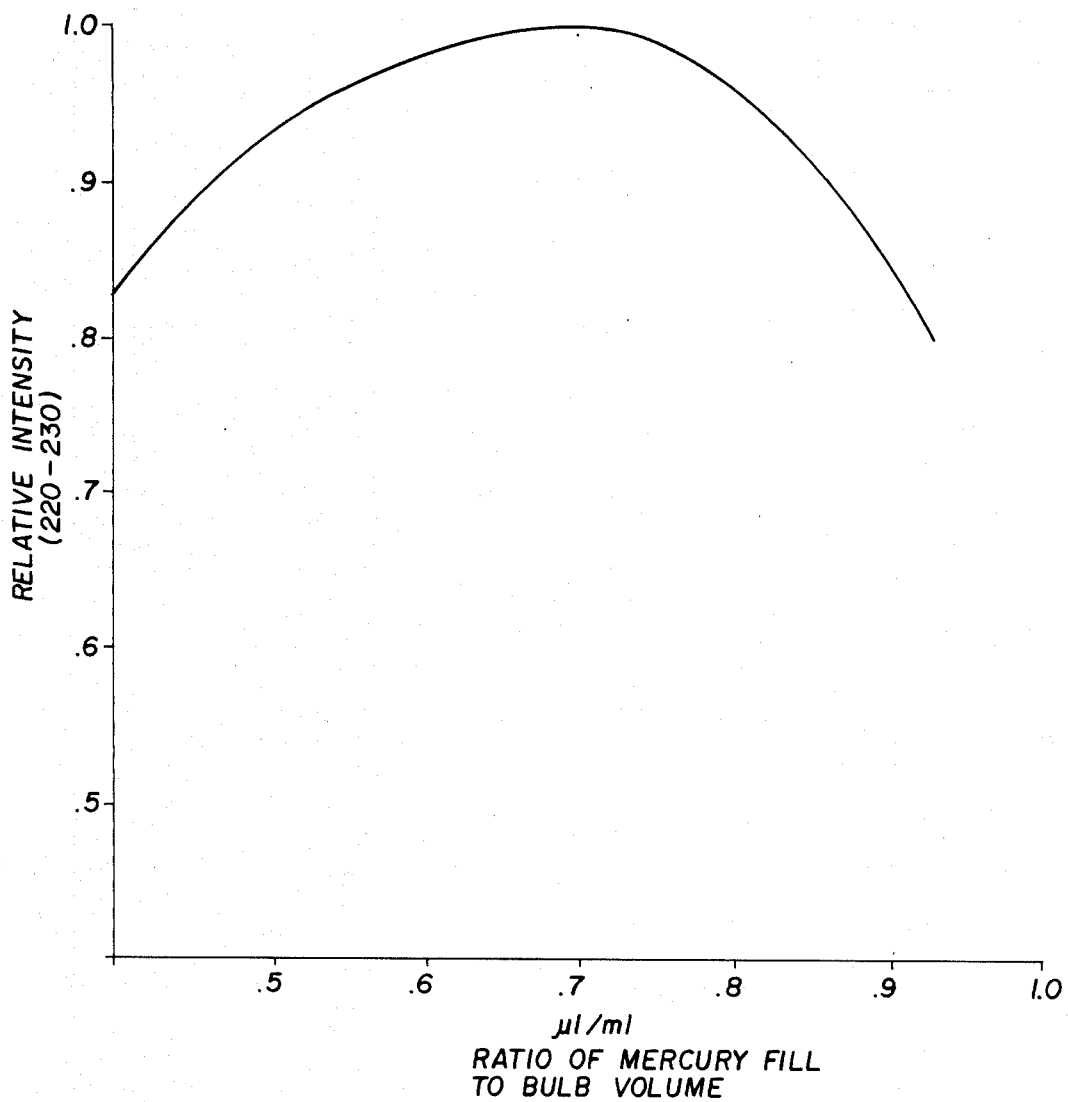
FIG. 2 is a graph of mercury fill ratio versus deep UV output for the electrodeless lamp bulb of FIG. 1.

FIG. 2 is a graph of deep UV relative bulb output intensity (220–230 nm) vs. mercury fill ratio. It will be observed that maximum output is obtained at a ratio of about 0.65 μl/ml, and that the intensity falls to about 87% of maximum at 0.5 μl/ml and to about 80% of maximum at 0.9 μl/ml. An output of about 80% of maximum is adequate for some applications.

An analysis of electrodeless bulb physics revealed that increasing mercury pressure results in coupling of higher microwave power levels to the bulb, which would be desirable if other variables were not adversely affected. However, as the amount of mercury in the bulb is increased it has been determined that increased absorption of radiated energy by the plasma itself occurs, and in particular, preferential absorption of deep UV wavelengths. For example, in the linear electrodeless lamp sold by Fusions Systems Corporation, which is a high power lamp used primarily for providing ultraviolet at conventional wavelengths, the mercury fill ratio has been determined to be 1.16 $\mu$l/ml, which it is believed while is high enough to provide good power coupling, also results in excessive absorption of deep UV radiation. On the other hand in the relatively low power electrodeless bulbs disclosed in the above-mentioned U.S. patents, the fill ratio is 0.3–0.4 $\mu$l/ml which does not permit adequate power coupling.

With the above theory in mind, the volumetric ratio of mercury was varied by applicants in order to obtain the information depicted in FIG. 2, to define the critical range of volumetric ratios for the deep UV output depicted. It is only by using a ratio falling within this critical range that a suitable lamp bulb for performing deep UV photolithography can be provided. While the data depicted in FIG. 2 is for a bulb having an internal diameter of 18.5 mm it is significant to note that the critical volumetric ratio is independent of bulb diameter and bulb geometry.

Additionally, it is desired for a substantial portion of the deep UV emission to occur at the outer radii of the bulb. This is because a neutral boundary layer occurs between the discharge and the inside wall of the quartz envelope, and this layer as well as the plasma itself absorbs deep UV radiation, thus attenuating emitted output.

In order to provide emission at the outer radii, it is necessary for the skin depth $\epsilon$, the distance from the envelope into the bulb over which microwave energy is absorbed, to be as small as possible. However, the smaller the skin depth, the more difficult it is to couple power into the bulb, and again a compromise for producing maximum for operation at a microwave frequency of 2450 Mhz and power densities in excess of 300 watts/cc, the critical fill ratio range of 0.5–0.9 $\mu$/ml results in a suitably small skin depth, so that deep UV radiation is emitted at the outer radii, resulting in minimal absorption by the plasma and neutral boundary layer.

In a preferred embodiment a quartz envelope 18.5 mm in diameter is filled with 2.1 $\mu$l of Hg, including argon at 90 torr and also may include a small amount of HgCl$_2$, about 0.1 mg. Further, the envelope is made of water-free, synthetic quartz for long operational lifetime, which is described in greater detail in co-pending U.S. application Ser. No. 433,070, assigned to the same assignee as the present application.

Figure 3:
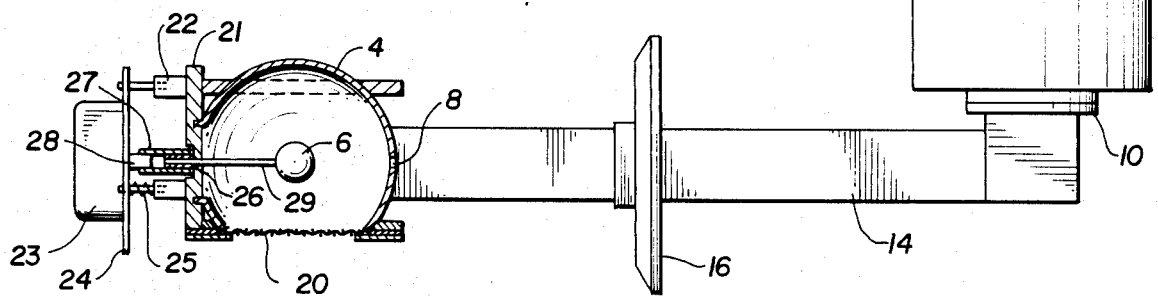
FIG. 3 is a schematic representation of an embodiment of an electrodeless light source incorporating the bulb of the invention.

Referring to FIG. 3, an embodiment of a microwave generated light source in which the improved lamp bulb of the invention is utilized, is illustrated. The light source is comprised of microwave chamber 4 and electrodeless lamp bulb 6, which is disposed in the chamber. The lamp bulb envelope is arranged to have a maximum dimension which is substantially smaller than a wavelength of the microwave energy utilized to excite the plasma in the bulb, and chamber 4 has a slot 8 for efficiently coupling microwave energy to the bulb.

The microwave energy is supplied by magnetron 10 which is activated by a power supply 12, and the microwave energy generated by the magnetron is fed through rectangular waveguide section 14 tunable by tuning stub 16, to the slot 8 in microwave chamber 4.

The interior of chamber 4 is coated with a UV reflective material and the chamber has an opening 18 for allowing deep ultraviolet radiation which is emitted by the lamp bulb to pass out of the chamber. The opening is covered with metallic mesh 20 which is substantially transparent to the emitted ultraviolet radiation, but substantially opaque to the microwave energy within the chamber.

For advantageous results, the chamber is arranged to be near-resonant, but not resonant as calculated for an ideal chamber without a bulb present. It has been found that a condition of near-resonance results in maximum coupling of energy to the small bulb 6, and consequently maximum light output therefrom. In order to maximize coupling, the chamber is arranged to be near-resonant at a single wavelength rather than at a multiple of wavelengths, which facilitates efficient absorption of the microwave energy. The relative, positioning of the slot 8 and opening shown in FIG. 3 provide a relatively uniform UV output through mesh 20.

Magnetron 10 provides about 1500 watts of microwave power at a frequency 2450 Mhz, and a major part of this power is coupled to the plasma, resulting in a power density of approximately 500 watts/cc. The resulting light source has a conversion efficiency in the deep UV part of the spectrum of about 8%, and is a bright source which radiates at about 190 watts/cc.

It will be appreciated that the high power density at which the lamp is operated causes the surface of the quartz envelope of bulb 6 to become extremely hot. In order to suitably cool the envelope, a cooling system is employed wherein the envelope is rotated while a plurality of jets of cooling gas are directed at it.

Referring to FIG. 3, it will be seen that lamp envelope 6 has a stem 29 which is rotated by motor 23. The motor shaft is connected to stem 29 via a mechanical coupler so that the stem is effectively an extension of the motor shaft, and also in FIG. 3 a mechanical configuration using flange 21, motor mounting flange 24, and spacing posts 22 is illustrated.

Figure 4:
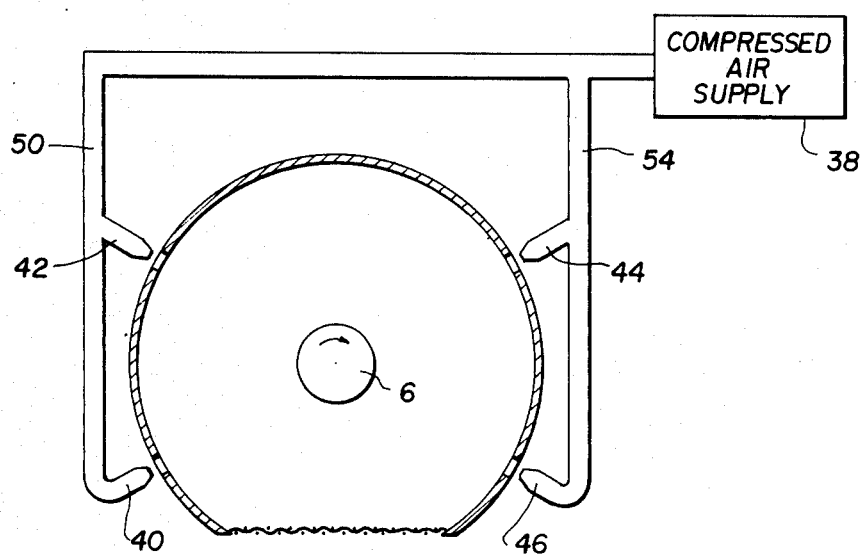
FIG. 4 is a schematic representation of a cooling system for the light source of FIG. 3.

FIG. 4 shows the system for directing cooling gas at the envelope as it rotates, and is seen to depict nozzles 40, 42, 44, and 46, which are fed by compressed air supply 38. The nozzles are directed approximately at the center of the envelope and combine with the rotation to provide a substantial cooling effect. In the embodiment illustrated all of the nozzles are located in a plane which passes through the center of the sphere. However, with bulbs having a diameter of 1 inch or larger, more effective cooling may be obtained if the nozzle 40 is offset slightly to one side of the chamber center plane while nozzle 42 is offset slightly to the other side, and similarly for nozzles 44 and 46.

In an actual embodiment of the light source shown in FIG. 3, metallic chamber 4 is a 3.9 inch diameter sphere having a 2.8 inch circular opening which is covered by mesh 20. Mesh 20 is a grid of 0.0017 inch diameter wires having a spacing of 0.033 inches between wire centers. Spherical lamp envelope 6 is 18.5 mm in interior diameter and is filled with 2.1 $\mu$l of Hg, a noble gas such as argon at 90 torr and may include a small amount of HgCl$_2$, about 0.1 mg.

There thus has been disclosed an improved deep UV lamp bulb as well as a light source in which said bulb may be employed.

It should be understood that while certain embodiments of the invention have been disclosed, variations falling within the scope of the invention may occur to those skilled in the art, and the invention is limited only by the claims appended hereto, and equivalents.

We claim:

1. An electrodeless lamp bulb for producing a relatively high output in the deep UV part of the spectrum, comprising:
   a quartz envelope which does not contain electrodes therein, and
   a fill inside said envelope consisting essentially of mercury in a ratio of form 0.5-0.9 µl per ml of envelope volume at room temperature.

2. The lamp bulb of claim 1 wherein said fill also includes argon.

3. The lamp bulb of claim 2 wherein said envelope is spherical and has an inside diameter of 10 mm to 35 mm.

4. A relatively bright electrodeless lamp for producing a relatively high output in the deep UV part of the spectrum, comprising,
   means for generating microwave energy,
   a lamp bulb comprising a quartz envelope and a fill inside said envelope consisting essentially of mercury in a ratio of from 0.5-0.9 µl per ml of envelope volume at room temperature, and
   means for coupling said generated microwave energy to said lamp bulb.

5. The electrodeless lamp of claim 4, wherein said means for coupling comprises,
   means for coupling said microwave energy to said bulb at a power density exceeding 250 watts/cc.

6. The electrodeless lamp of claim 5 wherein said means for coupling includes a microwave chamber in which said bulb is disposed, said chamber having a slot therein for admitting said microwave energy.

7. The lamp of claim 6 wherein said lamp envelope has a maximum dimension which is substantially smaller than a wavelength of said microwave energy.

8. The lamp of claim 7 wherein said microwave chamber has an opening for allowing deep UV radiation to escape, which is covered by a mesh which is substantially transparent to deep UV radiation but substantially opaque to microwave energy, and wherein said microwave chamber without said envelope in it is a near-resonant cavity.

* * * * *